United States Patent
Blinov et al.

[11] Patent Number: 5,643,365
[45] Date of Patent: Jul. 1, 1997

[54] METHOD AND DEVICE FOR PLASMA VAPOR CHEMICAL DEPOSITION OF HOMOGENEOUS FILMS ON LARGE FLAT SURFACES

[75] Inventors: L. M. Blinov, Moscow, Russian Federation; W. Neuberger, FT Labuan, Malaysia; V. V. Pavlov, Moscow, Russian Federation

[73] Assignee: Ceram Optec Industries Inc, East Longmeadow, Mass.

[21] Appl. No.: 686,464

[22] Filed: Jul. 25, 1996

[51] Int. Cl.$^6$ .................................................. C23C 16/00
[52] U.S. Cl. .......................... 118/723 MW; 427/575; 118/723 ME
[58] Field of Search .................. 427/575; 118/723 MW, 118/723 MR, 723 MA, 723 ME, 723 MP, 718; 156/345; 204/298.38; 216/69

[56] References Cited

U.S. PATENT DOCUMENTS

| | | | |
|---|---|---|---|
| 4,863,756 | 9/1989 | Hartig et al. | 427/39 |
| 4,971,832 | 11/1990 | Arai et al. | 427/39 |
| 5,132,105 | 7/1992 | Remo | 423/446 |
| 5,360,483 | 11/1994 | Kurokawa et al. | 118/723 E |
| 5,360,485 | 11/1994 | Bou et al. | 118/723 |
| 5,364,481 | 11/1994 | Sasaki et al. | 118/718 |
| 5,405,645 | 4/1995 | Sevillano et al. | 427/10 |
| 5,449,412 | 9/1995 | Pinneo | 118/723 |
| 5,464,667 | 11/1995 | Kohler et al. | 427/577 |
| 5,522,343 | 6/1996 | Kodama et al. | 118/723 MP |

FOREIGN PATENT DOCUMENTS

| | | | |
|---|---|---|---|
| 480581A | 4/1992 | European Pat. Off. | C23C 16/44 |

*Primary Examiner*—John Niebling
*Assistant Examiner*—Joni Y. Chang
*Attorney, Agent, or Firm*—Bolesh J. Skutnik

[57] ABSTRACT

A method and apparatus for efficiently depositing a dielectric film with a preselected thickness pattern, in particular, a homogeneous, uniform diamond or diamond-like film, on large area substrates through the use of opposing plasma torches and linearly superimposing of microwave modes within the reaction chamber creating and maintaining an extended linear plasma in close proximity to the substrate surfaces and utilizing laminar flow of the reactant gases in the plasma and over the surfaces. Substrate surfaces can be moved past the opposing torches permitting the coating of large area, rectangularly-shaped substrate surfaces in a simple manner. Alternatively, the plasma horn or horns can be moved across the substrate permitting coating of large area, rectangularly-shaped substrate surfaces.

20 Claims, 3 Drawing Sheets

METHOD AND DEVICE FOR PLASMA VAPOR CHEMICAL DEPOSITION OF HOMOGENEOUS FILMS ON LARGE FLAT SURFACES

BACKGROUND OF THE INVENTION

1. Field of the Invention

The present invention relates to plasma assisted deposition of thin, homogeneous films from gaseous precursors onto temperature stable substrates with large surface areas and in particular to a new method and device for Plasma assisted Chemical Vapor Deposition (PCVD) of diamond films, diamond-like films and similar materials on large area quartz, glass and ceramic substrates.

2. Information Disclosure Statement

The unique characteristics of diamond and diamond-like films (DF and DLF) have begun to be recognized and used in the development of flat panel displays, of heat sinks for powerful lasers, of cold cathodes having high current densities, etc. Characteristics of the films can be modified through the use of mixtures of working gases to provide carbon moieties and other elements for 'molecular alloys.' For example, methane, acetylene, carbon monoxide, carbon dioxide, alcohol vapors, carbon tetrachloride and tetrafluoride can serve as carbon sources, typically in an argon carrier gas containing oxygen or hydrogen to produce the diamond or diamond-like films. There remain many problems with achieving preselected properties for diamond and diamond-like films deposited on substrates with large surfaces, e.g. >100 $cm^2$, especially specific thickness patterns, including uniform thickness over large to very large surfaces, >1000 $cm^2$.

The current problems with the prior art are well summarized in Pinneo (U.S. Pat. No. 5,449,412). The commercial utility of microwave enhanced CVD deposition of diamond films is limited due to difficulty in coverage of large areas due to small plasma size and presence of large thermal gradients which degrade deposition uniformity. These problems adversely affect the economics and limit the range of applications of PCVD systems for many materials beyond diamond depositions.

Small plasma size creates serious problems because the deposition process varies strongly with respect to proximity to the plasma for numerous critical parameters, such as growth rate, diamond quality and surface structure. The nonuniformities which arise strongly affect the economic and technical feasibility of manufacturing products having diamond films by microwave plasma CVD process.

One attempt to treat larger areas by PCVD techniques is by Bou et al. (U.S. Pat. No. 5,360,485). Here the deposition is remoted from the space where initial plasma formation occurs. The deposition zone extends outside the waveguide to provide a larger area for deposition to occur and to reduce thermal exposure of substrate. Substrates still are heated to about 1000° C. The configuration is essentially a cone shape. Relatively flat and long substrates cannot be coated with this set up because of the difficult geometry, however, as described within the patent, large numbers of small substrates could be handled simultaneously, i.e. for preparing small sample substrates, large total areas are possible to coat uniformly. In summary then, larger areas can be coated, but only for small individual pieces or for special rounded shapes like cones. It is not clear how controlled or uniform the deposition can be since the properties of the plasma may change along the path as described in the patent.

Most of the other prior art which is trying to expand the area that can be coated use a ball plasma as their starting point. The general limitation of such plasmas is that as the plasma energy is increased, the size of the plasma ball diameter increases, moving the center of the plasma further away from the substrate. For example, Smith in EPO 0480581A forms a plasma ball over a substrate to be covered. It is clear from geometric considerations alone only a small part of surface of the plasma can be in close proximity to the substrate surface to be coated. Since the majority of the plasma volume becomes more distant from the substrate surface as the power of the plasma is increased for high rate deposition conditions, Smith introduces high speed recirculating of the reactive gas mixture around the support holding the substrate in contact wt. the plasma. The main problem, being attacked by Smith, is the lifetime of the reactive species becoming shorter than the path to the substrate. The supersonic flows, described in this patent and figures, must be turbulent in the vicinity of the surface to be coated, which gives rise to increasing difficulty in achieving uniform deposition conditions across any section of the substrate surface which is being coated.

Sevillano et al. in U.S. Pat. No. 5,405,645 deals with analyzing the composition of a ball plasma by spectrally following the $C_2$ formed in relation to the concentration of hydrogen atoms in the plasma. Using 5 kW of power, they found ratios of $C_2/H$ which corresponded to high rates of deposition of diamond-like coatings on their substrates. Its main emphasis is simply on achieving deposition rates of >10 mg/hr. It is noted that the deposition is enhanced typically at the center of the substrate, which is closest to the plasma. Powerful plasmas can deposit diamond or diamond-like coatings over broad areas and at high rates but the thickness will vary generally inversely with the square of distance from the center of the substrate being coated. High rates are achieved but one is left with a strongly varying thickness across the coated area.

A good attempt to solve the problems was suggested in U.S. Pat. No. 5,449,412 where a ball plasma is scanned across a substrate's surface to yield a deposition area significantly larger than achieved by other methods. There is some discussion within this reference of mixing a microwave and a reflection of the microwave to position the active plasma region within a reaction tube. The solution offered in this patent still has potential problems of non-uniformity in the deposited coating across the initial ball-like deposition area as well as along the scanned direction. Also the scan parameters and those of the plasma must remain constant over the time of the deposition or be able to be varied very consistently if a uniform coated area is to be produced. The modulation of the microwaves as they approach and exit the horns merely attempts improvement in one dimension, a ball plasma is still the base configuration for the deposition. Neither coating of really large (>100 $cm^2$) substrate areas nor highly uniform, preselected coating thicknesses are currently able to be achieved reliably and economically.

In summary, the prior art has continued to approach several of the problems associated with achieving highly controlled depositions over large surfaces but without complete success, especially as to uniform properties over even large sections of very large surfaces. The present invention is designed to provide solutions to these problems.

OBJECTS AND SUMMARY OF THE INVENTION

It is an object of the present invention to provide an efficient method and apparatus for the deposition of diamond, diamond-like or similar films on substrates with large areas without the problems associated with the prior art.

Another object is to provide a narrow and evenly ionized plasma zone in close proximity to the surfaces of the substrates to be coated with a diamond or diamond-like film.

A further object of the invention is to provide a method and apparatus where substrates to be coated can be used as components of the deposition chamber, thereby further enhancing the economic benefits of the method.

An additional object is to provide an apparatus and method to create large area, rectangularly shaped diamond or diamond-like films with predetermined thickness patterns, which can be converted into free standing films for numerous electronic, optronic, and thermal management applications.

Briefly stated, the present invention provides a method and apparatus for efficiently depositing a dielectric film with a preselected thickness pattern, in particular, a homogeneous, uniform diamond or diamond-like film, on large area substrates through the use of one or two plasma torches and a linear superposition of microwave modes within the reaction chamber creating and maintaining an extended linear plasma in close proximity to the substrate surfaces and utilizing laminar flow of the reactant gases in the plasma and over the surfaces. Substrate surfaces can be moved past the torch or torches permitting the coating of large area, rectangularly-shaped substrate surfaces in a simple manner. Alternatively, the plasma horn or horns can be moved across the substrate permitting coating of large area, rectangularly-shaped substrate surfaces.

The above, and other objects, features and advantages of the present invention will become apparent from the following detailed description read in conjunction with the accompanying drawings.

DETAILED DESCRIPTION OF PREFERRED EMBODIMENTS

Figure 1:
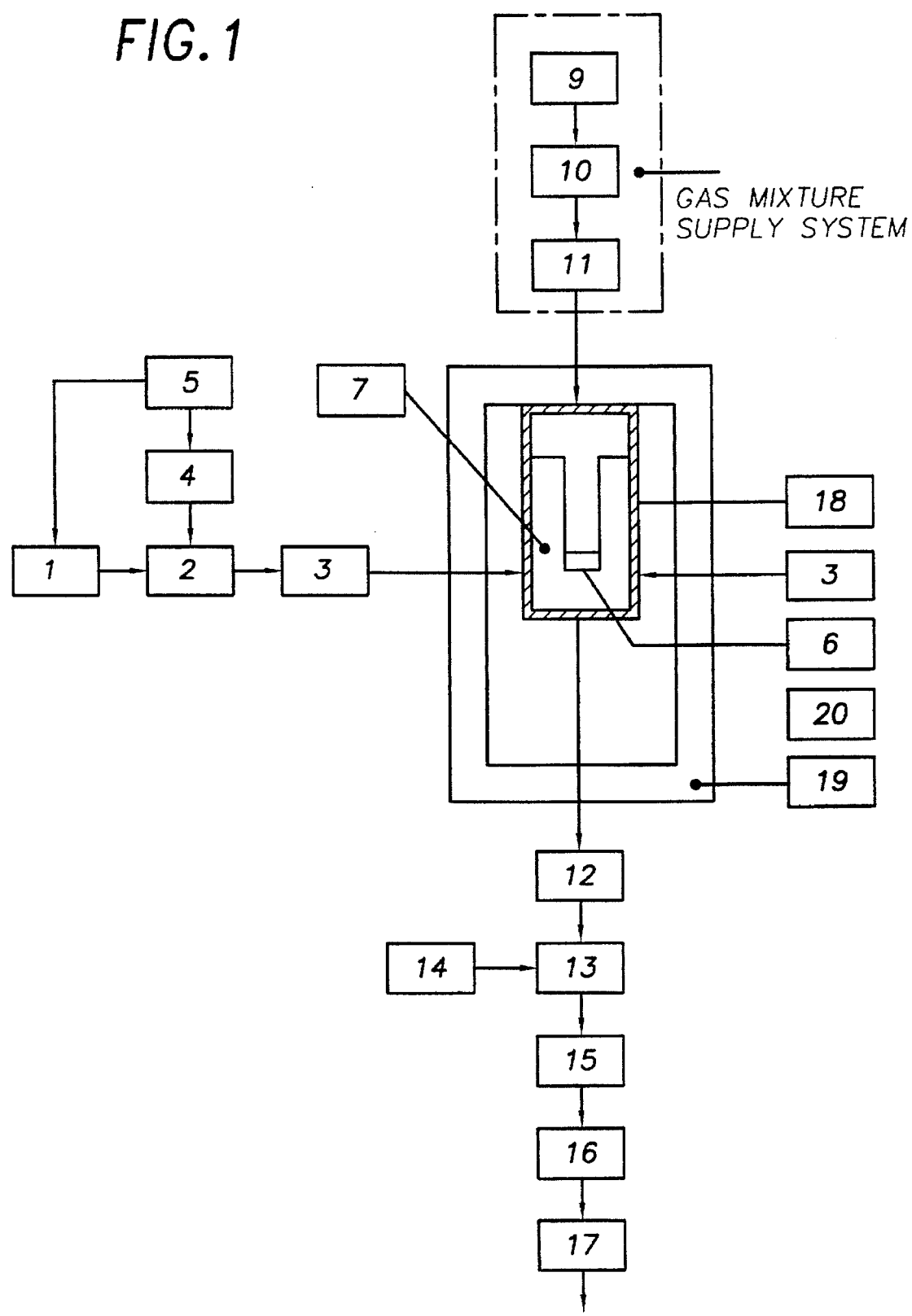
FIG. 1 shows a schematic of an embodiment of a plasma system for diamond film deposition according to the present invention.

It is known that low pressure plasma assisted deposition of DF and DLF has many unique, and beneficial potential characteristics, including:
1. inherent cleanness of the process;
2. high deposition speeds;
3. capability to coat surfaces of 10 to 100 cm²; and
4. process stability with highly reproducible characteristics for the films.

A large number and variety of processes are known to occur within the gaseous phase of a microwave generated plasma, making for highly complex interactions in general. Typically, molecular dissociation, formation of active and excited particles, presence of different ions and radicals, electromagnetic radiation and absorption, particle diffusion to the surface, heat and mass transfer and potentially reactions between all the species present occur more or less simultaneously within the plasma state. Ultimately the speed of film growth and the film characteristics are determined by the correlations of the various particle flows over the substrate surfaces.

The present invention describes a new method and apparatus for coating diamond, diamond-like and similar material films onto dielectric substrates with large areas, typically greater than 100 cm² and even above 1000 cm², especially flat or nearly flat surfaces. This is accomplished by forming a narrow and evenly ionized plasma zone within a deposition chamber such that the substrate surface to be coated is in close proximity to the plasma zone. Particularly advantageous from a commercial point of view is the use of the substrates to be coated as components of the deposition chamber, for example the opposing walls of a rectangularly-shaped chamber where the inner walls are the surfaces to be coated. Providing laminar flows of the reactive gas mixture along both surfaces while also providing adequate microwave power density would create a narrow, evenly ionized plasma zone in close proximity to the substrates. When the power density in the plasma zone is maintained at a minimum microwave power level, a most commercially beneficial process is achieved.

At the present time microwave generators are industrially available for several frequencies; 540 MHz, 915 MHz, 2.45 GHz and 6.00 GHz with 2.45 GHz having the most stable and developed equipment. The frequency chosen defines the wavelength of the radiation and thus affects the size of the plasma formed. While lower frequencies, <2.45 GHz, would appear to be better for larger area depositions, because their wavelengths will be longer, the nonuniformities related to plasma size are not simply abolished. Selection of longer and longer wavelength radiation, however, increases the probability of failure from frequency-related effects. Also the lower frequency equipment is generally more costly and more importantly not as stable as the standard 2.45 GHz generating equipment. Stability of the power input is critical to achieving controlled, uniform deposition over the extended periods of time required for very large surface areas. For these reasons 915 MHz, whose equipment is nearly as well developed as that for 2.45 GHz, is selected as a preferred frequency with its wavelength of approximately 33 cm. Other frequencies can be used depending on the desired areas to be covered and the economic and technological requirements of the particular application.

A key point of the present invention is the relationship of the dimensions of the plasma horn to the wavelength selected such that a constructive combination of microwave modes, such as $H_{10}$ and $H_{30}$, occur within the plasma zone. The various parameters are demonstrated in the following example. To provide a diamond film on a surface of flat quartz plates having an area of 7000 cm², i.e. 70 cm×100 cm [700 mm×1000 mm], then an ideal plasma zone would be of 700 mm×15 mm×10 mm generated at 915 MHz with power levels between 5 and 50 kW and a pair of plasma horns having heights of about 85 cm combining modes of $H_{10}$ and $H_{30}$ with an amplitude ratio of about 1:0.3. The power levels given above provide for deposition rates that correspond to prior art devices operating at several times higher power levels than these, because the microwave power density in the present device is significantly higher at 400–500 W/cm³, than in the prior art.

FIG. 1 shows one preferred embodiment of the present invention as a block diagram. Microwave generator 1 with regulated output power of 5 to 50 kW and operating at a frequency of 915 MHz is connected to a plasmatron, consisting of a system of two horns 3, by means of waveguide(s) 2. Generator 1 is controlled by controller 5 through feedback system 4. The microwave plasmatron through its system of horns 3 forms a local plasma zone about 15 mm wide in quartz reactor 6 in a space between flat quartz substrates 7 having dimensions of 700 mm×1000 mm. The total dimensions of a deposition chamber containing the surface to be coated is naturally limited by the dimensions of electric furnace 19.

A local plasma is formed which can be moved along substrate 7 surfaces by shifting device 18 of the reactor. A uniform laminar flow of a reactive gas mixture is supplied to a space between substrates 7 by an automatic system for mixing gases consisting of control trait 9, component gas containers 10, and mixing chamber 11. A contact surface of the plasma with each substrate surface is 700 mm×15 mm, or 105 cm$^2$, and the volume of the plasma zone is equal to 700 mm×15 mm×10 mm, or 105 cm$^3$. This corresponds to a power density in the plasma between substrates 7 equal to about 475 to 500 W/cm$^3$ with an output power of generator 1 of about 50 kW. Such a power density is more than sufficient to provide active species of the key components of the reactive gas mixture. The configuration of the plasma horns and the condensed volume of the plasma zone contribute to achieving a high efficiency in power density versus microwave output power.

Diamond film is deposited on inner surfaces of both substrates 7 as a result of interactions between the reactive gas mixture flowing in the space between the substrates and the microwave plasma discharge within the reactor's low working pressure, $P_{working}$=1.0 to 200 Torr. How parameters are controlled by a vacuum system consisting of initial vacuum pump 16 made of anticorrosive materials, pressure maintaining system 13, controller 14, initial vacuum vessel 15, and system for neutralization of reaction products 17. Where necessary to maintain elevated temperatures of the substrates during the diamond film deposition, typically at about 1000° C., the deposition chamber is enclosed in electric furnace 19 with a power package and a thermal control unit 20.

By moving plasma horns 3 the linear plasma zone can be moved over substrates' 7 surfaces to carry a deposition out over a broad area, e.g. ≧7000 cm$^2$. The relative motion between the plasma horns and the substrate can be at rates of several meters per minute, typically 0.5 to 5 m/min. The rate is determined by the desired thickness of the deposited film and the deposition rate itself. For the deposition process overall there are several critical parameters which must be held constant during the deposition in order to obtain a uniform deposition over the entire surface area to be covered. These parameters are the microwave power, the working pressure within the reactor, the reactive gas mixture consumption and the rate of motion for the plasma zone over the substrate surface. The dimensions of the plasma zone are held constant, at e.g. 700×15×10 mm, by monitoring and regulating the microwave power delivered by the plasma horns to the reactor and the reactive gas mixture pressure because the plasma volume is dependent on these two parameters.

In the embodiment, described above, two plasma horns 3 were used, but one horn would be adequate where only one surface was to be coated. The use of plasma horns 3 with a symmetrical coherent horn structure and with an even split in power between the two waveguides carrying the microwaves from the generator to the horns improves the uniformity of the microwave field emitted into reactor chamber 6, providing for a more even ionization of the gases within the plasma zone, and thus yielding a more uniform deposition onto substrate surfaces in contact with the plasma zone.

In a particular version of the invention, the inside walls of the deposition chamber (reactor 6) function as the substrate surfaces onto which diamond film is deposited. In such cases the walls should be composed of microwave compatible dielectrics such as: quartz, borosilicate glass, forsterite, beryllium ceramic, or selected carbides, nitrides and other materials, where the microwave loss, through substrates of up to 10 mm thick, is not more than 0.1% of the transmitted microwave energy.

Figure 2:
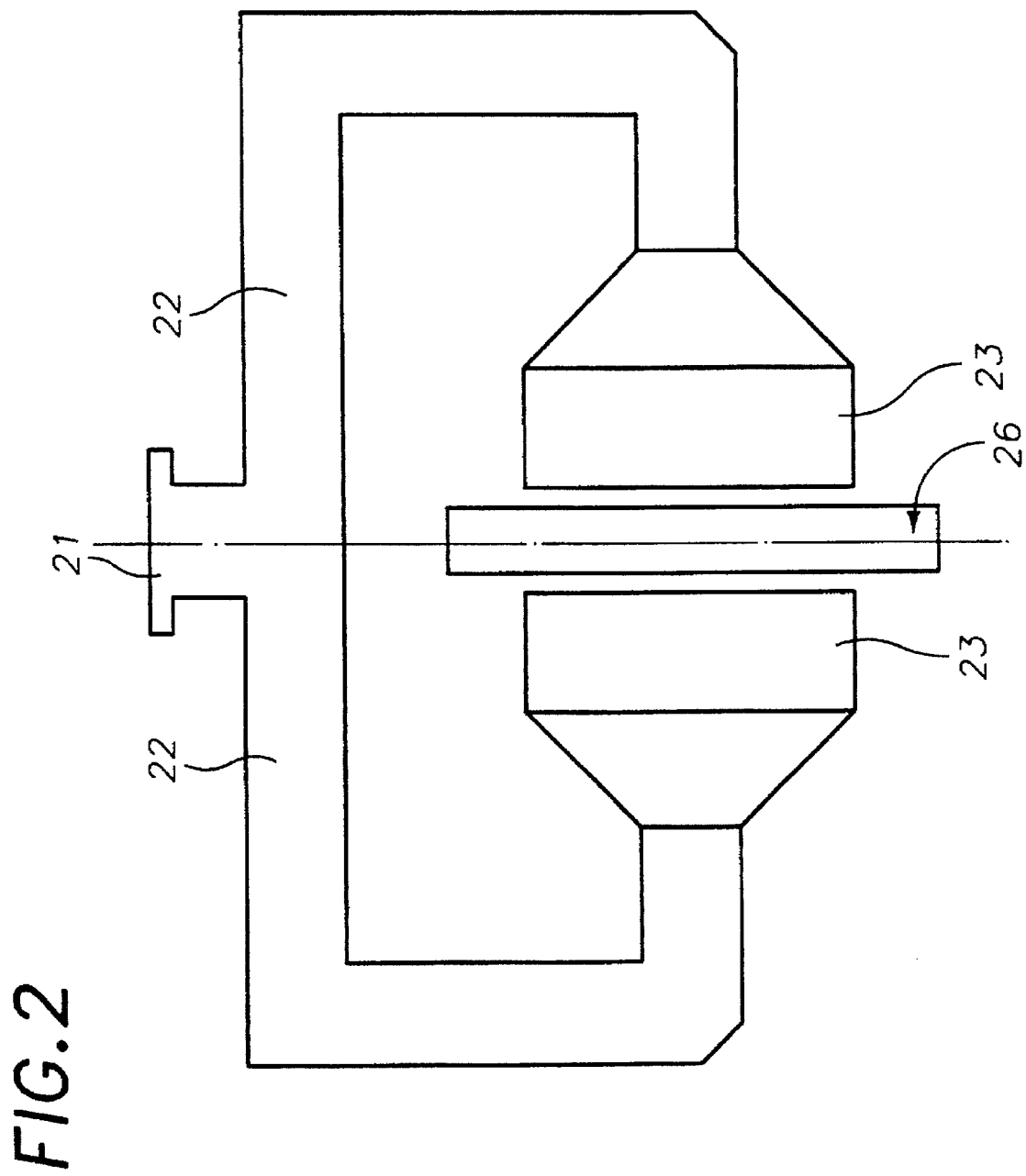
FIG. 2 shows an expanded view of a horn arrangement to create a long, linear plasma.

In FIG. 2 and the examples given below waveguide sections 22 were constructed using known microwave theory with steps so as to generate in horn sections 23 at least microwaves $H_{10}$ and $H_{30}$ with an amplitude ratio of 1:0.3. The tall dimension of the horn should be about 2.5 times the wavelength of the microwave in vacuum. Note that the horns 23 are facing each other with deposition chamber 26 between them. In this arrangement the plasma zone lies in the volume between the inner walls and in close proximity to the wall surfaces so that the narrow, linear plasma forms substantially along the two surfaces.

Figure 3:
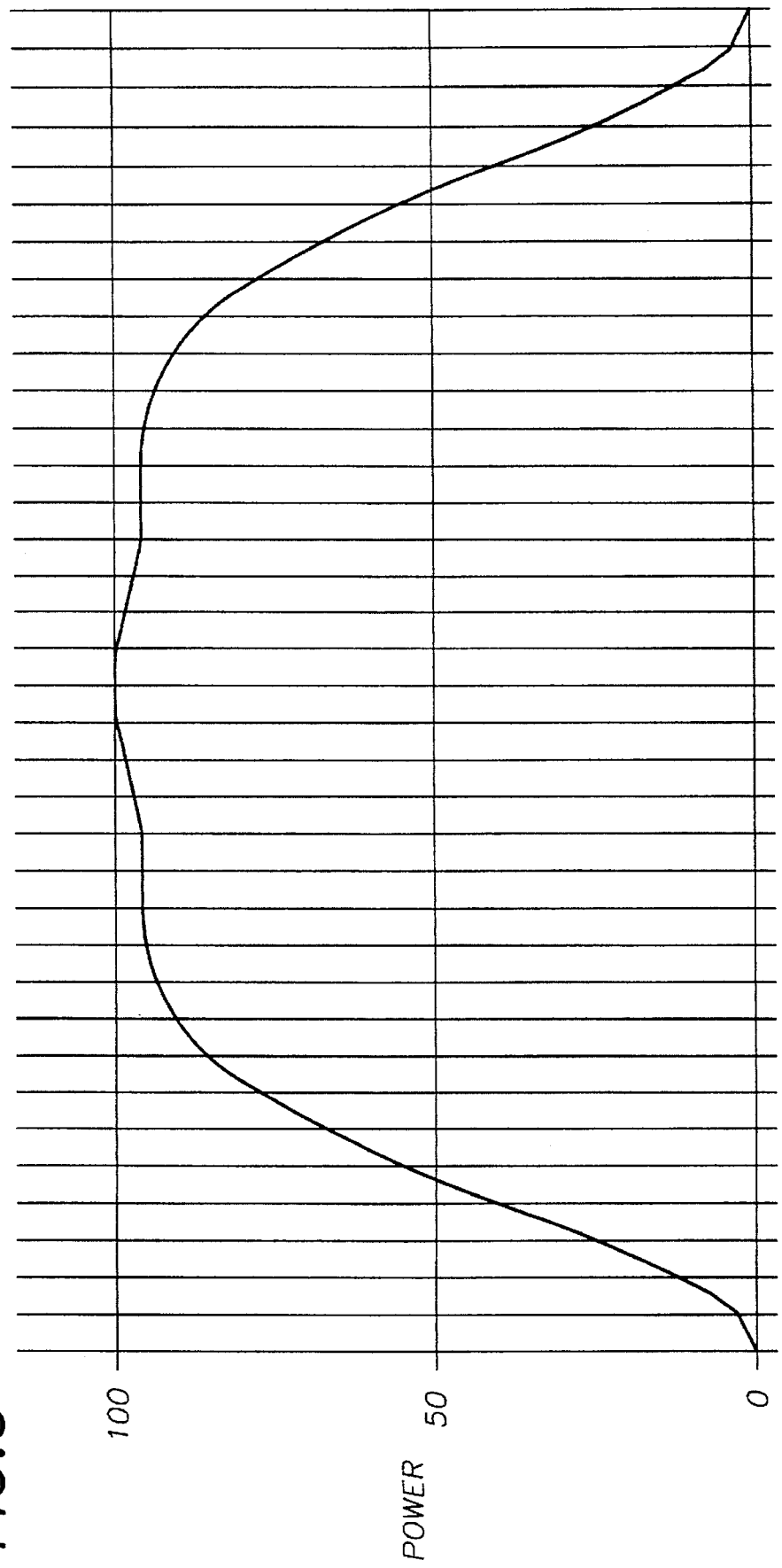
FIG. 3 shows the distribution of power across the horn depicted in FIG. 2.

In general with a single plasma horn, the surface to be deposited on is arranged to face the horn and the plasma zone will be offset towards the surface to be coated by having the constructive combination of microwave modes occur on or near the substrate's surface. The narrow, linear plasma forms along the substrate's surface and yields a uniform deposition which can be broadened by either scanning the horn over the substrate's surface or moving the substrate past the plasma horn. The superimposing of the microwave modes, $H_{10}$ and $H_{30}$ provides a more uniform microwave energy across the long dimension of the horns and is illustrated in FIG. 3 where the microwave power is plotted across the height of the horn section used. Providing stable resonance for even higher order modes will yield slightly broader, more uniform energy distributions across the length of the resulting plasma horn. By keeping the microwave power confined in space and at a high uniform level across the length of the horn the plasma zone is also confined and higher power densities, thus higher deposition rates are achieved with lower output power than in the conventional case where large ball plasmas are employed.

By way of example and not to anyway restrict its application, in the following examples, the present invention was used to deposit a crystalline diamond film and a non-crystalline diamond-like film on quartz substrates in the two examples described below.

Two quartz glass substrates having dimensions of 700× 1000 mm were arranged as inner walls of a deposition chamber. The reactive gas was a mixture of methane and oxygen in a 3:2 ratio with about 0.5% of argon which flowed through the deposition chamber at a pressure of 20–40 Torr and total gas flow of 50,000 cc/min. The substrates were held at a temperature of 900°–950° C. by electric furnace 19. The microwave frequency was 915 MHz and the power was 40–50 kW. The narrow, linear plasma was swept across the substrate's larger dimension at a speed of 2 m/min. The deposition rate was greater than 20 μm/min and the film deposited on the substrates displayed the characteristic peak of crystalline diamond at 1333 cm$^{-1}$.

In another case, using again two quartz glass substrates with dimensions of 700×1000 mm as the inner walls of a deposition chamber, the reactive gas was changed to a mixture of acetylene, hydrogen and argon in substantially equal parts. The gas mixture was introduced into the chamber at a total pressure of 10–20 Torr and a total gas flow of about 60,000 cc/min. The substrates were not heated independently but were subject to the plasma's heat, roughly 600°–800° C. The microwave frequency was 915 MHz and the power was 25–30 kW. The narrow, linear plasma was swept across the substrate's larger dimension at a speed of 2 m/min. The deposition rate was about 60 μm/min and the film deposited on the substrates did not display the characteristic peak of crystalline diamond at 1333 cm$^{-1}$, thus demonstrating that a glassy diamond-like film had been deposited on the substrates.

Total working pressures of reactive gas mixtures have ranged from 0.1 to 200 Torr and a variety of proportions between carbon source gases, hydrogen and dilution gas, such as argon. Typically, to obtain diamond films the substrates are heated independently to temperatures around 1000° C., when possible. For diamond-like films the substrates are not generally heated except by the heat generated by the plasma itself. Patterned bands along a broad substrate can be generated by varying the speed of the plasma zone as it travels across the substrate surface or alternatively varying deposition conditions in a smooth manner to transition between thicker and thinner bands along the surface as the plasma zone travels across the substrate surface. This would be particularly advantageous for depositions leading ultimately to free standing films. The latter are easily obtained by employing thinner substrates which are etched away after the deposition is complete, using standard techniques of the material science and semiconductor communities. The free standing films can then be cut into pieces of desired size as required by the end use application, e.g. heat sinks for laser diodes or diode bars.

Having described preferred embodiments of the invention with reference to the accompanying drawings, it is to be understood that the invention is not limited to these precise embodiments, and that various changes and modifications may be effected therein by one skilled in the art without departing from the scope or spirit of the invention as defined in the appended claims.

What is claimed is:

1. A method for coating large, dielectric surfaces with a dielectric film, having a thickness pattern, by a plasma enhanced CVD deposition process, using a microwave generated plasma, comprising the steps of:
   a. introducing a dielectric substrate having a substantially flat surface with greater than 100 cm$^2$ of area and having a length and a width to be coated into a deposition chamber having an essentially rectangular cross section;
   b. supplying said deposition chamber with a substantially laminar flow over said substrate's surface of a reactive gas mixture containing a coating material precursor;
   c. arranging a plasma horn facing said substrate's surface, wherein said plasma horn has one dimension, such that multiple microwave modes, will constructively combine at said surface of said dielectric substrate;
   d. generating microwaves and creating a narrow, linear plasma with said reactive gas mixture within said deposition chamber and in close proximity to said substrate's surface, wherein said combination of microwave modes yields a band of uniform plasma energy at said surface;
   e. depositing a coating onto said dielectric substrate's surface; and
   f. having said plasma move across said substrate's surface to controllably deposit a film with a thickness pattern over said substrate's entire surface, which is to be coated.

2. The method according to claim 1, wherein said dielectric substrate's surface is introduced as an inner wall defining said deposition chamber.

3. A method according to claim 1, wherein said dielectric substrate is a first dielectric substrate and said plasma horn is a first plasma horn and further comprising the step of:

g. splitting said microwaves into two substantially equal parts between a first waveguide and a second waveguide, exiting into said deposition chamber through said first plasma horn and a second plasma horn, respectively, which are facing opposing outer surfaces of said deposition chamber.

4. A method according to claim 3, further comprising the step of:
   h. introducing a second dielectric substrate having a substantially flat surface having a length and a width to be coated into said deposition chamber such that its surface to be coated is facing said first substrate's surface, supplying a substantially laminar flow of said reactive gas mixture over said second substrate's facing surface, creating said plasma between said two facing substrate surfaces and in close proximity to both surfaces to be coated, and having said plasma moving simultaneously across both substrates' surfaces to deposit a film with a thickness pattern over both substrates' entire surfaces.

5. The method according to claim 4, wherein said dielectric substrates' surfaces are introduced as opposing inner walls defining said deposition chamber.

6. The method according to claim 1, wherein said deposited dielectric film is a diamond or diamond-like film, and said microwaves have a frequency of less than 3 GHz.

7. The method according to claim 1, wherein said substrate's surface is moved across said linear plasma to insure said thickness pattern is deposited onto said surface.

8. The method according to claim 1, wherein said plasma horn is moved across said substrate's surface to insure said thickness pattern is deposited onto said surface.

9. The method according to claim 4, wherein said deposited dielectric film is a diamond or diamond-like film, and said microwaves have a frequency of less than 3 GHz.

10. The method according to claim 4, wherein said substrates' surfaces are moved across said linear plasma to insure said thickness pattern is deposited onto said surfaces.

11. The method according to claim 4, wherein said opposing plasma horns are moved across said substrates' surfaces to insure said thickness pattern is deposited onto said surfaces.

12. The method according to claim 1, wherein said thickness pattern of said deposited film is a uniform, homogeneous diamond or diamond-like film.

13. An apparatus for depositing by a plasma CVD process a dielectric coating having a thickness pattern on a dielectric substrate, having a surface area greater than 100 cm$^2$, comprising:

a deposition chamber having an essentially rectangular cross section and having means for introducing a dielectric substrate, with a substantially flat surface to be coated, into a plasma generated within said chamber;

a microwave generator system connected to said chamber, having a microwave generator attached to a waveguide and plasma horn facing an outer surface;

said plasma horn having one dimension, such that multiple microwave modes, will constructively combine at said substrate's surface;

means for introducing a reactive gas mixture containing a coating material precursor as a substantially laminar flow over said substrate's surface;

a linear plasma generated in said reactive gas mixture by said microwave generator system at said substrate's surface; and means for having said linear plasma move across said substrate's surface so as to deposit a film having a thickness pattern over said substrate's entire surface, which is to be coated.

14. The apparatus according to claim 13, further comprising:
    a splitter which essentially evenly splits a microwave into a first waveguide and a second waveguide and having a plasma horn on each waveguide facing opposing outer surfaces of said deposition chamber; and
    wherein said deposition chamber permits two dielectric substrates, each having a substantially flat surface to be coated, to be simultaneously exposed to said linear plasma with said reactive gas mixture in essentially laminar flow over both substrates' facing surfaces, and said linear plasma being generated between said substrates' facing surfaces and in close proximity to both.

15. The apparatus according to claim 13, wherein a wall of said deposition chamber opposing said plasma horn is a dielectric substrate having a substantially flat surface to be coated facing inward and towards said horn.

16. The apparatus according to claim 14, wherein both substrates' surfaces to be coated make up inner walls of said deposition chamber.

17. The apparatus according to claim 13, wherein said dielectric coating is a diamond or diamond-like film and said thickness pattern of said deposited film is a uniform, homogeneous film.

18. The apparatus according to claim 13, wherein said deposition chamber and said plasma horns are large enough to permit controlled film deposition on a substrate surface whose area is greater than 500 $cm^2$ or large enough to permit controlled film deposition on a substrate surface whose area is greater than 1000 $cm^2$.

19. The apparatus according to claim 14, wherein said dielectric coating is a diamond or diamond-like film and said thickness pattern of said deposited film is a uniform, homogeneous film.

20. The apparatus according to claim 13, wherein said deposition chamber and said plasma horns are large enough to permit controlled film deposition on substrate surfaces whose total area is greater than 500 $cm^2$ or large enough to permit controlled film deposition on substrate surfaces whose total area is greater than 1000 $cm^2$.

* * * * *